(12) United States Patent
Jin et al.

(10) Patent No.: US 7,638,706 B2
(45) Date of Patent: Dec. 29, 2009

(54) FIBRIL SOLAR CELL AND METHOD OF MANUFACTURE

(75) Inventors: Yong-Wan Jin, Seoul (KR); Jong-Min Kim, Suwon-si (KR)

(73) Assignee: Samsung SDI Co., Ltd., Yeongtong-gu, Suwon-si, Gyeonggi-do (KR)

( * ) Notice: Subject to any disclaimer, the term of this patent is extended or adjusted under 35 U.S.C. 154(b) by 810 days.

(21) Appl. No.: 11/043,040

(22) Filed: Jan. 27, 2005

(65) Prior Publication Data
US 2005/0194035 A1 Sep. 8, 2005

(30) Foreign Application Priority Data
Jan. 28, 2004 (KR) .................. 10-2004-0005316

(51) Int. Cl.
*H01L 25/00* (2006.01)
(52) U.S. Cl. ..................................... 136/243
(58) Field of Classification Search .............. 136/243
See application file for complete search history.

(56) References Cited

U.S. PATENT DOCUMENTS

| | | |
|---|---|---|
| 5,350,644 A | 9/1994 | Graetzel et al. |
| 5,441,827 A | 8/1995 | Graetzel et al. |
| 5,728,487 A | 3/1998 | Graetzel et al. |
| 2005/0040374 A1* | 2/2005 | Chittibabu et al. ........ 252/501.1 |

FOREIGN PATENT DOCUMENTS

| | | |
|---|---|---|
| EP | 0886804 B1 | 11/2001 |
| KR | 1997-7001433 | 7/2004 |

OTHER PUBLICATIONS

Solid-Sate Dye-Sensitized Mesoporous TiO$_2$ Solar Cells With High Photon-to-Electron Conversion Efficiencies, by Bach et al., *Nature* vol. 395, pp. 583-585, Oct. 9, 1998.

* cited by examiner

*Primary Examiner*—Rodney G McDonald
(74) *Attorney, Agent, or Firm*—Robert E. Bushnell, Esq.

(57) ABSTRACT

A fibril solar cell includes: a fiber-shaped inner core having a porous fiber composed of first carbon nanotubes and a cathode material, in which pores of the porous fiber are filled with second carbon nanotubes, titanium dioxide, a photosensitive dye, and an electron transfer electrolyte; a photoconductive layer formed on a surface of the fiber-shaped inner core and composed of at least one photoconductive polymer; a transparent electrode layer formed on a surface of the photoconductive layer; and a transparent protective layer formed on a surface of the transparent electrode layer and composed of at least one transparent polymer. The fibril solar cell can be mass-produced inexpensively using a polymer. Also, the fibril solar cell has a high efficiency and can be converted into various shapes. The fibril solar cell can be attached to clothing, and be used as a portable power source for mobile electronics.

10 Claims, 2 Drawing Sheets

CROSS SECTION A-A'

CROSS SECTION B-B'

CROSS SECTION C-C'

CROSS SECTION D-D'

CROSS SECTION E-E'

FIBRIL SOLAR CELL AND METHOD OF MANUFACTURE

CLAIM OF PRIORITY

This application makes reference to, incorporates the same herein, and claims all benefits accruing under 35 U.S.C. §119 from an application for FIBRIL SOLAR CELL AND METHOD OF MANUFACTURING THE SAME earlier filed in the Korean Intellectual Property Office on 28 Jan. 2004 and there duly assigned Ser. No. 10-2004-0005316.

BACKGROUND OF THE INVENTION

1. Field of the Invention

The present invention relates to a solar cell and a method of manufacturing the solar cell, and more particularly, to a fibril wet solar cell containing carbon nanotubes and having low manufacturing costs, high photo-conversion efficiency, and a good formability, and a method of manufacturing the solar cell.

2. Description of the Related Art

As global concerns about polluting energy sources increase, interest in alternative energy sources to fossil fuels, such as coal or petroleum, has increased. For example, a solar cell is a device for converting solar energy into electrical energy. Photovoltaic energy conversion is achieved by exposing the solar cell (p-n junction diode) to photons to generate negative electrons and positive holes, and transferring the electrons and the holes to electrodes to generate an electromotive force. Such a solar cell is generally classified as a silicon solar cell or a compound semiconductor solar cell, according to the constituting material thereof.

A single crystalline silicon solar cell is mainly used as a silicon solar cell, and is generally referred to as a dry solar cell. The single-crystalline silicon solar cell has a major advantage in that it can be made thin. However, since the single-crystalline silicon solar cell is very expensive, it is utilized only for special purposes, such as the aerospace industry. A relatively inexpensive amorphous silicon solar cell is available for use, but has a low photo-converting efficiency.

A compound semiconductor solar cell comprising $CuInSe_2$, CdTe, GaAs, and derivatives thereof has relatively good characteristics, but its use is very limited because of high cost, low efficiency, and low stability.

Currently, much consideration is being made for wet solar cells, which are low cost, environmentally-friendly, easily produced, and stable.

A wet solar cell consists of a semiconductor electrode and an electrolyte. A typical example of the wet solar cell is a combined solar cell having a crystalline $TiO_2$ electrode composed of an n-type semiconductor and a Pt electrode. If light is radiated onto a surface of the crystalline $TiO_2$ of the wet solar cell, electrons are excited, and transferred to a conduction band. When the electrons reach the Pt electrode through a lead wire, they react with protons to generate hydrogen. According to a principle of a typical wet solar cell, holes in a valance band deprive water molecules on the surface of $TiO_2$ of electrons. The holes disappear to generate oxygen. Instead of dissolving the water, the wet solar cell generates electrical energy via a resistor of an external circuit.

When the wet solar cell composed of the semiconductors absorbs light energy having a wavelength shorter than a desired level (i.e., having more than a band gap energy, $E_g$), carriers are increased, thereby generating an electric current. However, the wet solar cell cannot use light energy lower than $E_g$. Therefore, the wet solar cell composed of $TiO_2$, of which the band gap energy is 3.2 eV, can utilize only up to 4% of sunlight. Consequently, the efficiency of such a wet solar cell is very low.

In order to solve this problem, a wet solar cell having a band gap energy lower than that of $TiO_2$ to improve light absorbing efficiency of visible rays has been proposed. A desired dye capable of absorbing the visible rays is coated onto a surface of the semiconductor, and light of a wavelength to be absorbed by the dye is radiated onto the surface, such that the number of carriers in the semiconductor is increased. Such a wet solar cell is referred to as a dye-sensitized solar cell or Gratzell cell.

The dye-sensitized solar cell was first developed by Gratzell in Switzerland and used a dye sensitizer capable of absorbing visible light coated on $TiO_2$, which is a typical n-type semiconductor. A photosensitive dye of the n-type semiconductor absorbs photons to excite electrons, and the electrons circulate through an electric circuit via the n-type semiconductor. A redox substance receives the electrons from an opposite pole, and electrons of the photosensitive dye are returned to a ground state, so that the electrons are excited again.

There is currently some research on the dye-sensitized solar cell or Gratzell cell. Examples of the dye-sensitized solar cell are included in Nature vol. 395, pp. 583-585 (8 Oct. 1998), U.S. Pat. Nos. 5,350,644, 5,441,827, and 5,728,487, and European Patent No. EP0886804A.

These patents disclose dye-sensitized solar cells and their method of manufacture. The solar cell includes an electrode coated with $TiO_2$ coupled with ruthenium-bipyridiyl complex and an electrolyte. It is possible for the solar cell to generate an electric current from the visible light through the ruthenium-bipyridiyl complex (i.e., photosensitive dye). However, the dye-sensitized solar cell should utilize a liquid electrolyte. Since a space is formed between glass or plastic plates by a spacer in the solar cell, and the solar cell is sealed, it is difficult to manufacture the solar cell, which increases manufacturing costs. Also, since a generated voltage is very low (about 0.7 volts), there are some limitations for commercializing the solar cell.

Another example of a dye-sensitized solar cell is included in Korean Unexamined Patent Publication No. 1997-7001433, in which a solar cell has a fiber structure and utilizes ZnO and molybdenum. Since the solar cell utilizes a glass fiber, it is necessary to coat a semiconductor and an electrode having a high melting point, thereby increasing costs.

SUMMARY OF THE INVENTION

The present invention provides a fibril wet solar cell containing carbon nanotubes and having advantages of low manufacturing costs, high photo-conversion efficiencies, and a good formability, and a method of manufacturing the solar cell.

According to one aspect of the present invention, a fibril solar cell is provided comprising: a fiber-shaped inner core including a porous fiber including first carbon nanotubes and a cathode material; the porous fiber including pores filled with second carbon nanotubes; titanium dioxide; a photosensitive dye; and an electron transfer electrolyte; a photoconductive layer arranged on a surface of the fiber-shaped inner core and including at least one photoconductive polymer; a transparent electrode layer arranged on a surface of the photoconductive layer; and a transparent protective layer arranged on a surface of the transparent electrode layer and including at least one transparent polymer.

The first carbon nanotubes preferably comprise multiple walls or a single or double metallic walls, and are preferably contained in a concentration of 1 wt. % to 15 wt. % on the basis of a binder used for forming the porous fiber.

The cathode material preferably comprises tin oxide having a diameter of 10 nm to 50 nm, and is contained in a concentration of 1 wt. % to 5 wt. % on the basis of a binder used for forming the porous fiber.

The second carbon nanotubes preferably comprise multiple walls or a single or double metallic walls having a diameter of 10 nm to 100 nm, and are preferably contained in a concentration of 0.1 wt. % to 1 wt. % on the basis of a solution including the second carbon nanotubes, the titanium dioxide, the photosensitive dye, and the electron transfer electrolyte.

The titanium dioxide preferably comprises porous grains having a surface area of 200 $m^2$/g to 300 $m^2$/g, and a grain size of 1 nm to 50 nm.

The photosensitive dye preferably comprises a ruthenium-containing complex, an osmium-containing complex, an iron complex, and a super-heavy complex containing 2 or 3 transition metals.

The electron transfer electrolyte preferably comprises an iodine/iodide solution, a bromine/bromide solution, a hydroquinone solution, and a solution of transition metal complex to transport non-coupled electrons.

The photoconductive layer preferably comprises 1 wt. % to 5 wt. % of tin oxide having a particle size of 1 nm to 50 nm on the basis of the photoconductive polymer.

According to another aspect of the present invention, a method of manufacturing a fibril solar cell is provided, the method comprising: forming a porous fiber from a solution including first carbon nanotubes, a cathode material, and a binder, and heat-treating the porous fiber; impregnating the porous fiber with a solution including second carbon nanotubes, titanium dioxide, a photosensitive dye and an electron transfer electrolyte to form a fiber-shaped inner core; coating a surface of the fiber with a photoconductive polymer, and drying and planarizing the surface of the photoconductive polymer to form a photoconductive layer; coating a surface of the photoconductive layer with indium tin oxide to form a transparent electrode; and coating a surface of the transparent electrode with at least one transparent polymer to form a transparent protective layer.

The first carbon nanotubes preferably comprise multiple walls or a single or double metallic wall, and are preferably contained in a concentration of 1 wt. % to 15 wt. % on the basis of a binder used for forming the porous fiber.

The cathode material is preferably tin oxide having a diameter of 10 nm to 50 nm, and is preferably contained in a concentration of 1 wt. % to 5 wt. % on the basis of a binder used for forming the porous fiber.

The porous fiber is preferably formed using at least one foaming agent selected from the group consisting of ammonium carbonate, azobisisobutyronitrile (AIBN), and benzene sulfonylhydrazide.

The porous fiber is preferably formed using a wet spinning process.

The porous fiber is preferably heat treated at a temperature of 400° C. to 500° C.

The second carbon nanotubes preferably have multiple walls or a single or double metallic wall having a diameter of 10 nm to 100 nm, and are preferably contained in a concentration of 0.1 wt. % to 1 wt. % on the basis of a solution consisting of the second carbon nanotubes, titanium dioxide, the photosensitive dye, and the electron transfer electrolyte.

The titanium dioxide preferably includes porous grains having a surface area of 200 $m^2$/g to 300 $m^2$/g, and a grain size of 1 nm to 50 nm.

The photosensitive dye preferably includes ruthenium-containing complex, osmium-containing complex, iron complex, and super-heavy complex containing 2 or 3 transition metals.

The photoconductive layer preferably further includes 1 wt. % to 5 wt. % of tin oxide having a particle size of 1 nm to 50 nm on the basis of the photoconductive polymer.

According to still another aspect of the present invention, an article of clothing including a fibril solar cell is provided, the fibril solar cell comprising: a fiber-shaped inner core including a porous fiber including first carbon nanotubes and a cathode material; the porous fiber including pores filled with second carbon nanotubes; titanium dioxide; a photosensitive dye; and an electron transfer electrolyte; a photoconductive layer arranged on a surface of the fiber-shaped inner core and including at least one photoconductive polymer; a transparent electrode layer arranged on a surface of the photoconductive layer; and a transparent protective layer arranged on a surface of the transparent electrode layer and including at least one transparent polymer.

According to yet another aspect of the present invention, a portable power supply including a fibril-solar cell is provided, the fibril solar cell comprising: a fiber-shaped inner core including a porous fiber including first carbon nanotubes and a cathode material; the porous fiber including pores filled with second carbon nanotubes; titanium dioxide; a photosensitive dye; and an electron transfer electrolyte; a photoconductive layer arranged on a surface of the fiber-shaped inner core and including at least one photoconductive polymer; a transparent electrode layer arranged on a surface of the photoconductive layer; and a transparent protective layer arranged on a surface of the transparent electrode layer and including at least one transparent polymer.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Reference will now be made in detail to a fibril solar cell according to an embodiment of the present invention. Each of the accompanying drawings includes both longitudinal and transverse cross-sectional views.

Figure 1A:
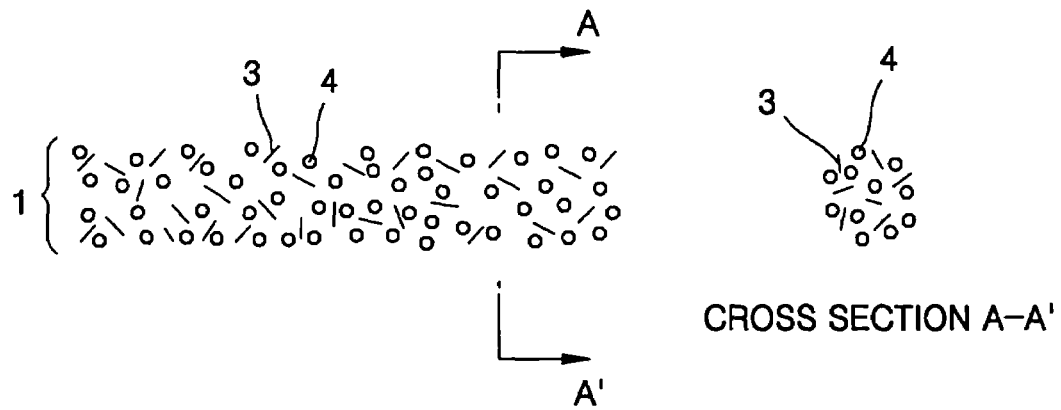
FIGS. 1A through 1E are cross-sectional views of a fibril solar cell according to an embodiment of the present invention.

Herein, the term "fibril solar cell" is defined to be a solar cell having a fiber structure, which is distinguishable from a laminated structure of the prior art. A cross-section of the fibril solar cell according to the embodiment of the present invention can have various shapes, for example, a globular shape or an elliptical shape, according to a manufacturing method, usage, etc., as shown in FIG. 1E. Also, a length of the fibril solar cell of the present invention can vary according to the manufacturing method or the usage.

Figure 1B:
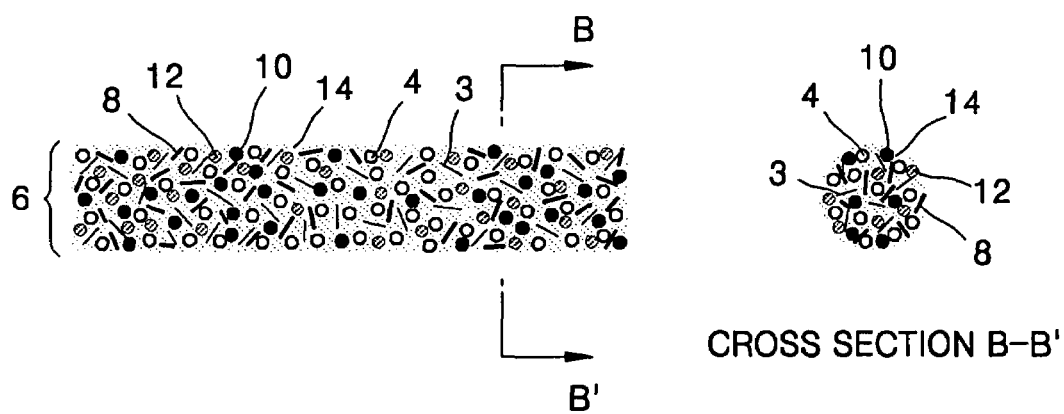

A fiber-shaped inner core 6 of the solar cell includes a porous fiber 1 composed of first carbon nanotubes 3 and a cathode material 4, and pores of the porous fiber 1 (FIG. 1A) filled with second carbon nanotubes 8, titanium dioxide 10, a photosensitive dye 12, and an electron transfer electrolyte, as shown in FIG. 1B.

The carbon nanotubes 3 and 8 each have a tubular shape in which hexagonal carbon groups consisting of 6 carbon atoms are coupled to each other. The carbon nanotubes 3 and 8 have an electrical conductivity similar to that of copper, and a thermal conductivity similar to that of diamonds (the thermal conductivity of diamonds is the highest of any natural material). Preferably, the carbon nanotubes 3 and 8 have multiple walls or a single or double metallic wall. For example, the carbon nanotubes 3 and 8 can be manufactured by the method discussed in Annual Review of Material Science, entitled "Carbon Nanotubes", vol. 24, pp. 235, written by Ennesen et al.

The carbon nanotubes 3 and 8 are embedded in the porous fiber 1 of the fiber-shaped inner core 6, and are preferably metallic carbon nanotubes. Since the carbon nanotubes 3 embedded in the porous fiber 1 have a high electrical conductivity, it facilities the performance of a cathode together with the cathode material 4. Also, the carbon nanotubes 3 have a high chemical resistance, and can therefore protect the fiber-shaped inner core 6 in an electrolyte 14 for a long time. In view of these characteristics, the carbon nanotubes 3 embedded in the porous fiber 1 are contained in a concentration of 1 wt. % to 15 wt. %, preferably 1 wt. % to 5 wt. %, on the basis of a binder. The binder can include, for example, polyvinyl alcohol.

The porous fiber 1 of the fiber-shaped inner core 6 includes the cathode material 4. The cathode material can be, for example, zinc oxide or tin oxide, of which the tin oxide is preferable. Since the fibril solar cell of the present embodiment employs the carbon nanotubes 3 and the cathode material 4, a high electrical conductivity and reducing characteristics can be obtained by using an inexpensive cathode material, for example, tin oxide instead of an expensive cathode material, for example, Pt. Preferably, the material 4 for the cathode, e.g., tin oxide, has a diameter of 10 nm to 50 nm, and is contained in a concentration of 1 wt. % to 10 wt. %, preferably 1 wt. % to 5 wt. %, on the basis of the binder.

The carbon nanotubes 8 are contained in the pores of the porous fiber 1 of the fiber-shaped inner core 6. The carbon nanotubes 8 improve the electrical conductivity of titanium dioxide, which in turn improves the performance of the fibril solar cell according to the present embodiment. In view of this aspect, the carbon nanotubes 8 preferably have multiple walls or a single or double metallic wall, a diameter of the walls being 10 nm to 100 nm. The carbon nanotubes 8 are contained in a concentration of 0.1 wt. % to 3 wt. %, preferably 0.5 wt. % to 1 wt. %, on the basis of a solution consisting of the carbon nanotubes 8, the titanium dioxide 10, the photosensitive dye 12, and the electron transfer electrolyte 14.

The titanium dioxide 10 contained in the fiber-shaped inner core 6 transfers electrons, which are exited by photons included in sunlight absorbed by the photosensitive dye to an electrode. In order to effectively cooperate with the photosensitive dye 12, the titanium dioxide 10 preferably has a porous structure to provide a larger surface area. The titanium dioxide 10 can have a total surface area of 200 m2/g to 300 m2/g, and a grain size of 1 nm to 50 nm. The titanium dioxide 10 is contained in a concentration of 70 wt. % to 80 wt. % on the basis of the solution consisting of the carbon nanotubes 8, the titanium dioxide 10, the photosensitive dye 12, and the electron transfer electrolyte 14.

Also, the fiber-shaped inner core 6 includes the photosensitive dye 12. Sunlight generally has a wavelength in a range of 300 nm to 2000 nm. The photosensitive dye 12 can absorb photons having a wavelength of about 820 nm to increase a photovoltaic effect. In view of this fact, preferably, the photosensitive dye 12 of the present embodiment includes a ruthenium-containing complex, an osmium-containing complex, an iron complex, or a super-heavy complex containing 2 or 3 transition metals. A ligand contained in the photosensitive dye 12 can include a bidentate chelate polypyridyl compound, tridentate chelate polypyridyl compound, and polydentate chelate polypyridyl compound, and at least one of the polypyridyl compounds includes a cyano group. The photosensitive dye 12 of the present embodiment can include cis-[bistiasyanato bis(4,4'-dicarboxylic-2,2'-bipyridine ruthenium (II))], but is not limited thereto.

The electrolyte 14 contained in the fiber-shaped inner core 6 of the present embodiment includes a redox system. Preferably, the redox system includes an iodine/iodide solution, a bromine/bromide solution, a hydroquinone solution, and a solution of transition metal complex transporting non-coupled electrons. Preferably, the electrolyte is the iodine/iodide solution, and more preferably, an iodine and dimethyl-hexyl-imidazolium iodide solution.

The electrolyte 14 contained in the fiber-shaped inner core 6 of the present invention can be an alcohol that is an organic solvent, a mixture of the alcohol, a nonvolatile solvent, or a mixture of a viscosity-reduced solvent and nonvolatile solvent. The nonvolatile solvent can be, for example, propylene carbonate, ethylene carbonate, or methyl pyrrolidine, but is not limited thereto. The viscosity-reduced solvent can be, for example, acetonitrile, ethyle acetate, or tetrahydrofuran, but is not limited thereto. In addition, dimethyl sulfoxide and dichloro ethane can be included as an additional solvent. Most preferably, the organic solvent employed in the fibril solar cell of the present embodiment is acetonitrile.

Figure 1C:
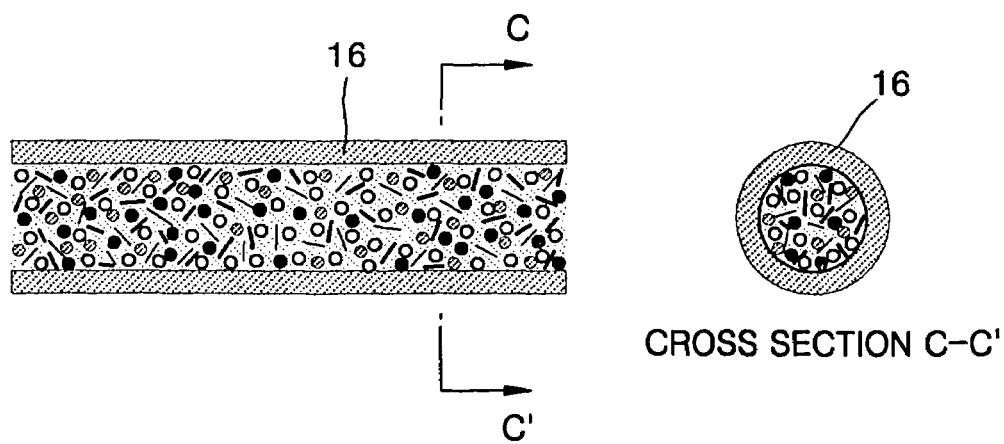

The fiber-shaped inner core 6 is surrounded by a photoconductive layer 16 composed of at least one conductive polymer, as shown in FIG. 1C. The photoconductive layer 16 generates a photoelectric current from light to improve the electric current output from the solar cell, and smoothly guides current flowing through a transparent electrode layer 18 coated on a surface of the photoconductive layer 16 to improve the entire performance of the fibril solar cell. When the fiber-shaped inner core 6 is manufactured through a wet spinning method, the surface of the fiber-shaped inner core is not smooth. The photoconductive layer serves to planarize the surface of the fiber-shaped inner core. The conductive polymer can be polyvinyl carbazol, polypyrrole, polyaniline, polythiophene, or polyacetylene, but is not limited thereto. Coating can be achieved by forming the fiber-shaped inner core by a conventional wet spinning or melting spinning, heat-treating the fiber-shaped inner core, or dipping the fiber-shaped inner core into the solution of titanium dioxide, photosensitive dye, and carbon nanotubes, but is not limited thereto.

The photoconductive layer 16 can further include of tin oxide particles, in addition to the conductive polymer. The tin oxide is mixed with the conductive polymer to generate a larger photovoltaic force. The tin oxide can have a grain size of 1 nm to 50 nm, and is contained in a concentration of 1 wt. % to 10 wt. %, more preferably 1 wt. % to 5 wt. %, on the basis of the photoconductive polymer.

Figure 1D:
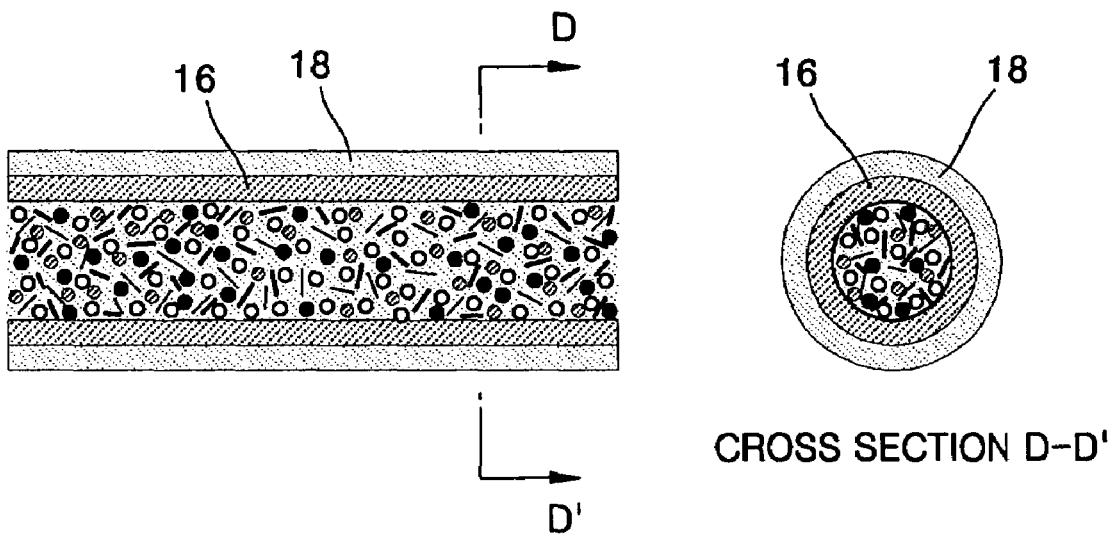
Figure 1E:
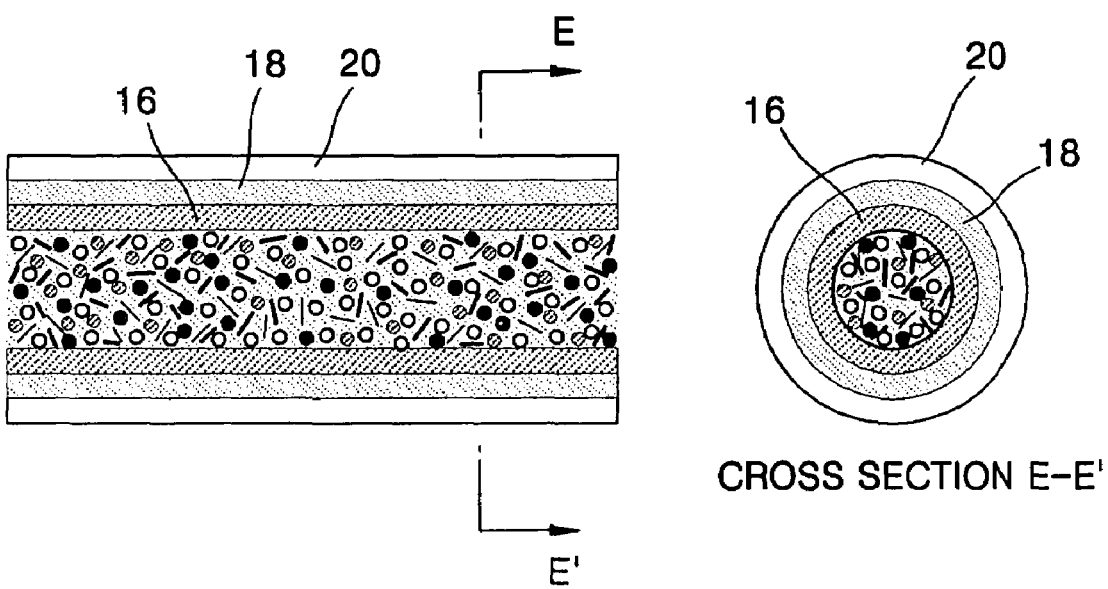

The fibril solar cell of the present embodiment includes the transparent electrode layer 18 composed of polymer coated on the surface of the photoconductive layer 16, as shown in FIG. 1D. The transparent electrode layer 18 has a surface resistance of up to 10 ohm/cm2, preferably 1 to 10 ohm/cm2. The polymer constituting the transparent electrode layer 18 is tin dioxide doped with fluorine of at a concentration of 0.8 wt. %. Also, Indium Tin Oxide (referred to as ITO glass) doped with tin oxide of at a concentration of up to 5 wt. % can be used as the polymer. A preferable polymer constituting the transparent electrode layer 18 is ITO.

ITO included in the transparent conductive layer 18 is preferably coated on the fiber by sputtering. A common-sputtering method is achieved as follows. When a negative voltage is applied to a target, secondary electrons having the same energy as the voltage applied to the target are sputtered from a surface of the target. The electrons impinge on a sputtering gas (for example, argon) in a sputtering chamber, and then the sputtering gas recoils into the surface of the target. If the initial energy applied to the target is small, a large number of incident ions are neutralized, and absorbed by the target. This mechanism results in ion implantation in which ionized particles are attracted to impinge on the surface of the target thereby changing the structure of the target, or ion scattering in which ionized particles are reflected from the surface of the target. However, if the initial energy is large, the number of ions merely reflected or attracted is reduced, and atoms are sputtered from the surface of the target. In addition to the atoms sputtered by the particles incident upon the surface of the target, secondary electrons are again sputtered from the surface. The atoms and secondary electrons impinge on the sputtering gas to cause a chain reaction generating a plasma. Then, the sputtered atoms are deposited on a substrate to form a thin film.

The fibril solar cell of the present embodiment includes a transparent protective layer 20 on the surface of the transparent electrode layer 18, as shown in FIG. 1E. The transparent protective layer 20 coats the electrode and is composed of a transparent polymer. The transparent polymer can be polyethyleneterephthalate, polyethylene, or polyethylenenaphthalate, but is not limited thereto.

A method of manufacturing a fibril solar cell according to an embodiment of the present invention comprises: preparing a porous fiber; impregnating the porous fiber with a solution for forming a solar cell; forming a photoconductive layer; and forming a transparent electrode layer and a transparent protective layer.

First, the porous fiber 1 is made from a solution consisting of carbon nanotubes 3, a cathode material 4, and a binder, and is then heat-treated.

After preparing the solution consisting of the carbon nanotubes 3, the cathode material 4, and the binder, the fiber is made from the solution through wet spinning. A common binder, for example, polyvinyl alcohol, can be used to manufacture the porous fiber 1. The binder is contained in the fiber forming solution, but can be eliminated in the heat-treating step.

The fiber can be made by wet spinning as follows. First, a spun undiluted solution is discharged into a solidifying bath filled with a solution containing a solvent via a gear pump and a spinning nozzle. Then, by mutual dispersion of a precipitant and the solvent contained in the spinning solution, and a solidifying solution, the precipitant permeates into the spinning solution. Therefore, a polymer, a solvent and a precipitant are phase-separated, resulting in precipitation, thereby solidifying a filament. After the solvent of the filament passing through the solidifying bath is completely extracted in a cleaning bath, the filament is passed through a drying unit, a stretching unit, a heating unit, and an emulsion treating unit, and then is wound around a winder. The extracted solvent is collected and recycled in a purifying process.

Preferably, the spun undiluted solution is in a concentration of up to 25%, since a speed of desolventization is low during the wet spinning. The cross-sectional shape of the filament made by the wet spinning can be irregular and coarse, unlike a filament made by dry spinning.

After the fiber containing the carbon nanotubes 3 and the cathode material 4 is formed, the fiber is heat-treated to have a porous structure. In order to produce pores in the fiber, a foaming agent, such as ammonium carbonate, azobisisobutyronitrile (AIBN), or benzene sulfonyl, is mixed with the fiber with a concentration of 1 wt. % to 10 wt. % on the basis of the binder, such as polyvinyl alcohol, before performing the heat-treating process. The heat-treating process is performed at a temperature of 400° C. to 500° C., preferably 430° C. to 470° C. If the heat-treating temperature is less than 400° C., it is difficult to produce enough pores in the fiber. If the heat-treating temperature is greater than 500° C., it is difficult to obtain desirable characteristics of the solar cell due to the damage to the carbon nanotubes 3.

Then, the porous fiber 1 is impregnated with a solution consisting of the carbon nanotubes 8, the titanium dioxide 10, the photosensitive dye 12, and the electron transfer electrolyte 14 to form the fiber-shaped inner core 6. The impregnation is performed at a temperature of 50° C. to 80° C. for 30 minutes to 1 hour. The surface of the fiber-shaped inner core 6 is coated with at least one photoconductive polymer, and is then dried, to form the photoconductive layer 16. The photoconductive layer is then planarized. The conductive polymer can be polyvinyl carbazol, polypyrrole, polyaniline, polythiophene, or polyacetylene, but is not limited thereto.

After forming the photoconductive layer 16, the surface of the photoconductive layer 16 is coated with a polymer to form the transparent electrode layer 18 through a sputtering method. The polymer can be ITO. The surface of the transparent electrode layer is coated with a polymer, which can be polyethyleneterephthalate, polyethylene, or polyethylenenaphthalate, to form the transparent protective layer.

The fibril solar cell of the present invention can be applied to clothing for use with a wearable computer.

The term "wearable computer" is defined to be a small portable computer that is designed to be worn on a body during use. A wearable computer is regarded as a futuristic computer and various types have been proposed and commercialized in some countries.

A personal computer is designed to be operated by a person sitting in front of the computer. Smaller portable notebook computers are portable, but are designed for use with the hands. The wearable computer can break down the general idea on the computer. The wearable computers could be integrated into a user's closthing or be attached to the body through some other means, like a wristband. Wearable computers can also be integrated into everyday objects that are constantly worn on the body, like a wrist watch or a hand-free cell phone.

The most important technology required to commercialize wearable computers is a power supply for the wearable computer. In order to effectively achieve the integrality between the wearable computer and the user, the wearable computer must be supplied with sufficient power without having a separate charger and without needing charging time. Also, the power supply must be light weight so as not to cause an inconvenience to the user and should be made of environmental-friendly material so as not to be harmful to the user. Since the fibril solar cell of the present invention has a fiber structure, it can be easily deformed to adapt to clothing. In addition, since the solar cell of the present invention employs sunlight, power can be continuously supplied without having a separate charger and without needing charging time. Also, since it does not use a glass plate, the solar cell of the present invention is light weight. Furthermore, the solar cell is environmentally friendly and is not harmful to the user. For the above reasons, the fibril solar cell of the present invention can be utilized as the power supply of a wearable computer or as a portable power supply.

Example Embodiment 1

Production of Fibril Wet Solar Cell

A. Production of Fiber 1 gram of multiple-wall carbon nanotubes (a product commercially available from CarboLex Inc.), 3 grams of tin oxide (a product commercially available from Aldrich Corporation) with a diameter of 10 nm, and 5 grams of ammonium carbonate were mixed with 91 grams of polyvinyl alcohol (containing water in a concentration of 80 wt. %) to prepare a solution for making a fiber. The solution was spun through a wet spinning to produce a fiber with a thickness of 500 um. Then, the fiber was heat-treated at a temperature of 430° C. for 30 minutes.

B. Impregnation of Photosensitive Dye

The porous fiber produced in process A was impregnated with a solution consisting of 1 gram of multiple-walled carbon nanotubes (a product commercially available from CarboLex Inc.), 72 grams of porous titanium dioxide (a product commercially available from Nano Co. Ltd.) with a diameter of 10 nm and a surface area of 250 m$^2$/g, 5 grams of potassium oxide, 15 grams of a ruthenium dye-containing compound (a product commercially available from STI Inc.), 5 grams of acetonitrile solution, 1 gram of dimethyl-hexyl-imidazolium iodide solution, and 1 gram of iodine, at a temperature of 50° C. for 30 minutes and dried at a temperature of 100° C. for 1 hour.

C. Formation and Planarization of Photoconductive Layer

After 0.97 gram of polyvinyl carbazol and 0.03 gram of tin oxide with a diameter of 10 microns were dissolved in 100 ml of methyl pyrrolidoine to produce a mixture for forming a photoconductive layer, the fiber obtained in the process B was impregnated with the mixture to coat the fiber, and was dried at a temperature of 150° C. for 30 minutes.

D. Formation of ITO Electrode

A surface of the product formed in the process C was sputtered with 2000 Å of ITO at room temperature for 10 minutes to coat the surface of the photoconductive layer.

E. Formation of Protective Layer

After 1 gram of polyethyleneterephthalate was dissolved in 1000 ml of methyl pyrrolidoine, the product formed in process D was coated with the polyethyleneterephthalate and dried at a temperature of 150° C. for 30 minutes.

Test: Evaluation of Example Embodiment Fibril Solar Cell

The efficiency of the fibril solar cell produced in the above process was measured using a voltage (V)–current (I) Curve Tracer (Techno Inc.) under 1 kW/m$^2$ at a temperature of 50° C. The efficiency was 7%, which is higher than that (5%) of a conventional Gratzell cell (made by Sustainable Technologies International).

The fibril solar cell of the present invention can be mass produced inexpensively using a polymer. Also, the fibril solar cell has a high efficiency and can be produced in various shapes. The fibril solar cell can be applied to clothing, and be used as a portable power source for mobile electronics.

While the present invention has been particularly shown and described with reference to exemplary embodiments depicted in the drawings, it is to be understood that various changes and modifications in form and details can be made therein without departing from the spirit and scope of the present invention. Therefore, the true spirit and scope of protection of the present invention is defined by the following claims.

What is claimed is:

1. A fibril solar cell, comprising:
    a fiber-shaped inner core including a porous fiber including first carbon nanotubes and a cathode material, with the porous fiber including pores being filled with second carbon nanotubes, titanium dioxide, a photosensitive dye, and an electron transfer electrolyte;
    a photoconductive layer arranged on a surface of the fiber-shaped inner core and including at least one photoconductive polymer;
    a transparent electrode layer arranged on a surface of the photoconductive layer; and
    a transparent protective layer arranged on a surface of the transparent electrode layer and including at least one transparent polymer.

2. The fibril solar cell of claim 1, wherein the first carbon nanotubes comprise multiple walls or a single or double metallic walls, and are contained in a concentration of 1 wt. % to 15 wt. % on the basis of a binder used for forming the porous fiber.

3. The fibril solar cell of claim 1, wherein the cathode material comprises tin oxide having a diameter of 10 nm to 50 nm, and is contained in a concentration of 1 wt. % to 5 wt. % on the basis of a binder used for forming the porous fiber.

4. The fibril solar cell of claim 1, wherein the second carbon nanotubes comprise multiple walls or a single or double metallic walls having a diameter of 10 nm to 100 nm, and are contained in a concentration of 0.1 wt. % to 1 wt. % on the basis of a solution including the second carbon nanotubes, the titanium dioxide, the photosensitive dye, and the electron transfer electrolyte.

5. The fibril solar cell of claim 1, wherein the titanium dioxide comprises porous grains having a surface area of 200 m$^2$/g to 300 m$^2$/g, and a grain size of 1 nm to 50 nm.

6. The fibril solar cell of claim 1, wherein the photosensitive dye comprises a ruthenium-containing complex, an osmium-containing complex, an iron complex, and a super-heavy complex containing 2 or 3 transition metals.

7. The fibril solar cell of claim 1, wherein the electron transfer electrolyte comprises an iodine/iodide solution, a bromine/bromide solution, a hydroquinone solution, and a solution of transition metal complex to transport non-coupled electrons.

8. The fibril solar cell of claim 1, wherein the photoconductive layer comprises 1 wt. % to 5 wt. % of tin oxide having a particle size of 1 nm to 50 nm on the basis of the photoconductive polymer.

9. An article of clothing, comprising:
    a fibril solar cell comprising:
        a fiber-shaped inner core including a porous fiber including first carbon nanotubes and a cathode material, with the porous fiber including pores being filled with second carbon nanotubes, titanium dioxide, a photosensitive dye, and an electron transfer electrolyte;
        a photoconductive layer arranged on a surface of the fiber-shaped inner core and including at least one photoconductive polymer;
        a transparent electrode layer arranged on a surface of the photoconductive layer; and
        a transparent protective layer arranged on a surface of the transparent electrode layer and including at least one transparent polymer.

10. A portable power supply, comprising:
    a fibril solar cell comprising:

a fiber-shaped inner core including a porous fiber including first carbon nanotubes and a cathode material, with the porous fiber including pores being filled with second carbon nanotubes, titanium dioxide, a photosensitive dye, and an electron transfer electrolyte;

a photoconductive layer arranged on a surface of the fiber-shaped inner core and including at least one photoconductive polymer;

a transparent electrode layer arranged on a surface of the photoconductive layer; and a transparent protective layer arranged on a surface of the transparent electrode layer and including at least one transparent polymer.

* * * * *